(12) United States Patent
Wada et al.

(10) Patent No.: US 9,372,243 B2
(45) Date of Patent: Jun. 21, 2016

(54) MAGNETIC SENSOR

(71) Applicant: TDK CORPORATION, Tokyo (JP)

(72) Inventors: Yoshimitsu Wada, Tokyo (JP); Nozomu Hachisuka, Tokyo (JP); Yoshihiro Kudo, Tokyo (JP); Jun Ono, Tokyo (JP); Nobutaka Nishio, Tokyo (JP)

(73) Assignee: TDK CORPORATION, Tokyo (JP)

( * ) Notice: Subject to any disclaimer, the term of this patent is extended or adjusted under 35 U.S.C. 154(b) by 48 days.

(21) Appl. No.: 14/335,248

(22) Filed: Jul. 18, 2014

(65) Prior Publication Data

US 2015/0054498 A1 Feb. 26, 2015

(30) Foreign Application Priority Data

Aug. 22, 2013 (JP) .................. 2013-172286

(51) Int. Cl.
*G01R 33/09* (2006.01)
(52) U.S. Cl.
CPC ............ *G01R 33/098* (2013.01); *G01R 33/091* (2013.01)
(58) Field of Classification Search
CPC .... G01D 5/2046; G01R 33/02; G01R 33/098; G01R 33/091
USPC ................................................... 324/207.21
See application file for complete search history.

(56) References Cited

U.S. PATENT DOCUMENTS 7,826,332 B2* 11/2010 Ishida ............... G11B 7/13
369/120
8,609,465 B2* 12/2013 Kawahara ............ H01L 21/565
438/113

2004/0157067 A1 8/2004 Kusumi et al.
2012/0286405 A1 11/2012 Toyota

FOREIGN PATENT DOCUMENTS

| JP | H09-289269 A | 11/1997 |
| JP | H11-289113 A | 10/1999 |
| JP | 2004-247408 A | 9/2004 |
| JP | A-2007-263951 | 10/2007 |
| JP | A-2010-078360 | 4/2010 |
| JP | A-2010-145285 | 7/2010 |
| JP | 2012-238796 A | 12/2012 |

OTHER PUBLICATIONS

Jun. 30, 2015 Office Action issued in Japanese Patent Applicaton No. 2013-172286.

* cited by examiner

*Primary Examiner* — Reena Aurora
(74) *Attorney, Agent, or Firm* — Oliff PLC (57) ABSTRACT

The magnetic sensor of the invention comprises a base portion, a sensor chip positioned on the base portion, a wiring portion adapted to electrically connect a terminal of the sensor chip to a connecting lead, a resin having a low elastic modulus for coating at least the sensor chip, and a resin having a high elastic modulus for coating at least the low elastic-modulus resin and the wiring portion, wherein the sensor chip includes a magneto-resistive effect device, and the low elastic-modulus resin has an elastic modulus ranging from 10 kPa to 80 MPa while the high elastic-modulus resin has an elastic modulus of 1 GPa or more, and enables the sensor chip to perform well in a good state although having a structure of sealing up the sensor chip with the resin member.

4 Claims, 7 Drawing Sheets

MAGNETIC SENSOR

BACKGROUND OF THE INVENTION

1. Field of the Invention

The present invention relates generally to a magnetic sensor, and more particularly to a magnetic sensor comprising a sensor chip having a magneto-resistive effect device, said sensor chip being sealed up in a resin.

2. Description of the Prior Art

In recent years, magneto-resistive effect devices (MR devices) such as those of the giant magneto-resistive effect (GMR), tunnel magneto-resistive effect (TMR) and anisotropic magneto-resistive effect (AMR) types have been applied to the magnetic sensor field. Typically, the GMR or TMR type magneto-resistive effect devices comprise a magnetization-fixed layer having a direction of magnetization fixed relative to an external magnetic field (pinned magnetic layer) and a magnetization-free layer having a direction of magnetization variable depending an external magnetic field (free magnetic layer). As an external magnetic field acts on such a magneto-resistive effect device, it causes the direction of magnetization of the magnetization-free layer to change, generating a change in the relative angle with the direction of magnetization of the magnetization-fixed layer. The change in the direction of magnetization appears as a change in the magneto-resistance of the magneto-resistive effect device, by which the intensity of the external magnetic field may be detected.

A magnetic sensor making use of such a magneto-resistive effect device has a typical structure in which a sensor chip including a magneto-resistive effect device placed on a base member, desired wirings or the like connected to the terminals of the sensor chip are sealed up in a resin member for their protection, and magnetic sensors of such a structure are used for angle sensors, etc. (Unexamined Patent Publication Nos. 2007-263951, 2010-78360 and 2010-145285).

However, a problem with a magnetic sensor having such a resin-sealed structure is that upon subjected to an external force, there is stress applied to the sensor chip via the resin member, resulting in a change in the sensor chip characteristics. For instance, with an angle sensor having a built-in magnetic sensor harnessing the magneto-resistive effect device, the angle measured while stress is applied to the sensor chip tends to have errors; a problem with that angle sensor is that it cannot be used in fields of detecting the angle of rotation, etc. of a rotating shaft with high precision in a stable manner. On the other hand, the TMR type magneto-resistive effect device is higher in MR ratios than, and much superior in output performance to, the AMR or GMR type magneto-resistive effect device, but, to the contrary, it is sensitive to stress acting on the sensor chip. For this reason, a magnetic sensor making use of the TMR type magneto-resistive effect device in particular is still required to have a structure less susceptible to stress, although depending on its purpose.

The situations being like this, an object of the present invention has for its object to provide a magnetic sensor having a structure in which a sensor chip including a magneto-resistive effect device is sealed up in a resin member, and which enables the sensor chip to perform well in a good state.

SUMMARY OF THE INVENTION

Such an object of the invention is achieved by the provision of a magnetic sensor comprising a base portion, a sensor chip positioned on said base portion, a wiring portion adapted to electrically connect a terminal of said sensor chip to a connecting lead, a resin having a low elastic modulus for coating at least said sensor chip, and a resin having a high elastic modulus for coating at least said low elastic-modulus resin and said wiring portion, wherein said sensor chip includes a magneto-resistive effect device, and said low elastic-modulus resin has an elastic modulus ranging from 10 kPa to 80 MPa while said high elastic-modulus resin has an elastic modulus of 1 GPa or more.

In another embodiment of the invention, said low elastic-modulus resin has an elastic modulus ranging from 10 to 250 kPa.

In still another embodiment of the invention, said low elastic-modulus resin for coating said sensor chip has a minimum thickness of 5 µm or more.

The magnetic sensor of the invention enables the sensor chip to perform well in a good state although it has a structure wherein the sensor chip including a magneto-resistive effect device is sealed up with the resin member.

EXPLANATION OF THE PREFERRED EMBODIMENTS

Some embodiments of the invention are now explained with reference to the drawings.

It should be noted that the drawings are schematic or conceptual in nature; members' dimensions, size ratios of members, etc. are not always coincident with real ones. It should also be understood that even the same members may differ in terms of mutual dimensions and ratios from one drawing to another.

Figure 1:
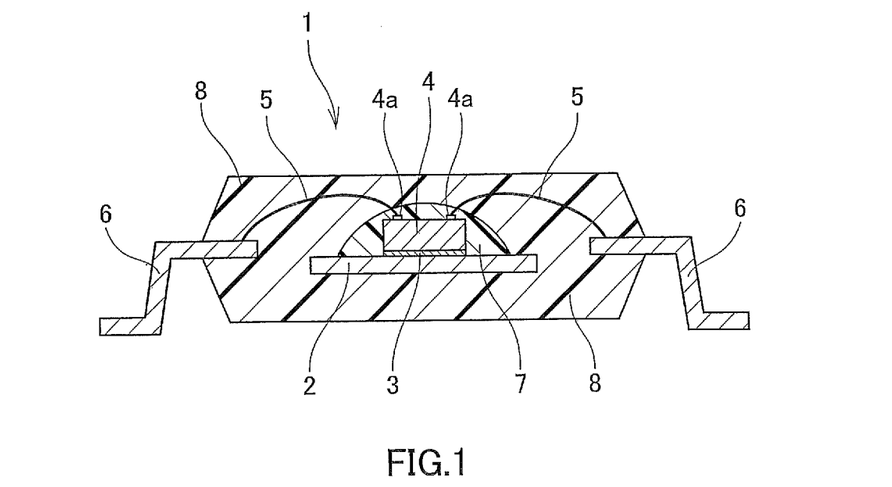
FIG. 1 is illustrative in section of one embodiment of the magnetic sensor according to the invention.

FIG. 1 is illustrative in section of one embodiment of the magnetic sensor according to the invention. As shown in FIG. 1, a magnetic sensor generally indicated by 1 comprises a base portion 2, a sensor chip 4 placed on the base portion 2 via an adhesive layer 3, a wiring portion 5 for electrically connecting a terminal 4a of the sensor chip 4 to a connecting lead 6, a low elastic-modulus resin 7 for coating the sensor chip 4, and a high elastic-modulus resin 8 for coating and sealing up the base portion 2, wiring portion 5 and low elastic-modulus resin 7.

Figure 2:
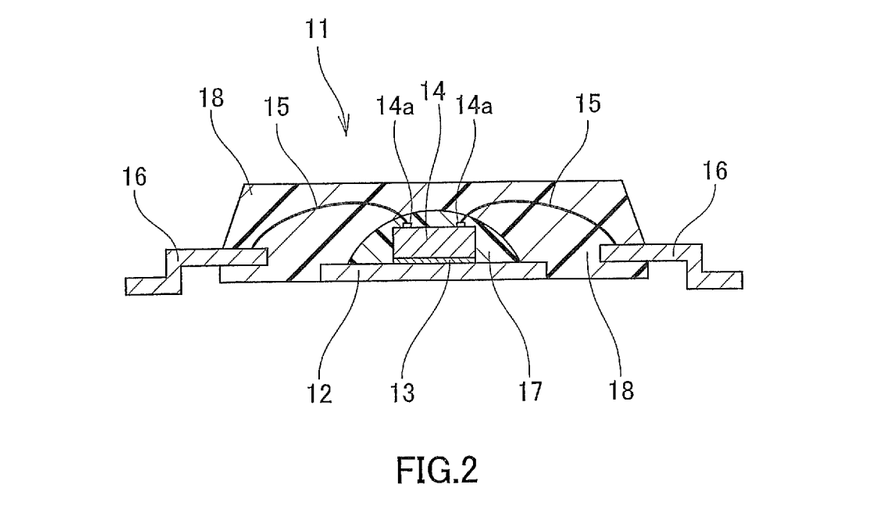
FIG. 2 is illustrative in section of another embodiment of the magnetic sensor according to the invention.

FIG. 2 is illustrative in section of another embodiment of the magnetic sensor according to the invention. As shown in FIG. 2, a magnetic sensor 11 comprises a base portion 12, a sensor chip 14 placed on the base portion 12 via an adhesive layer 13, a wiring portion 15 for electrically connecting a terminal 14a of the sensor chip 14 to a connecting lead 16, a low elastic-modulus resin 17 for coating the sensor chip 14, and a high elastic-modulus resin 18 for coating and sealing up the wiring portion 15 and low elastic-modulus resin 17. This magnetic sensor 11 is different from the abovementioned magnetic sensor 1 in that the former includes the high elastic-modulus resin 18 such that the back surface of the base portion 12, viz. the surface of the base portion 12 in opposition to the surface having the sensor chip 14 positioned on it is exposed to view.

In FIGS. 1 and 2, it is to be noted that the sections of the sensor chips 4, 14 are indicated by one type of hatchings for the sake of convenience.

The components of the magnetic sensors according to the invention are now explained.

The base portion 2, 12 forming a part of the magnetic sensor 1, 11 may be formed of an electrically conductive material known as a lead frame material as is the case of the connecting lead 6, 16 to be described later. The adhesive layer 3, 13, via which the sensor chip 4, 14 is placed on such base portion 2, 12, may typically be formed of a conductive paste, an insulating paste, and a die-attach film (DAF).

The sensor chip 4, 14 forming a part of the magnetic sensor 1, 11 includes a magneto-resistive effect device, and is provided with a terminal 4a, 14a. The magneto-resistive effect device used here may typically be a tunnel magneto-resistive effect (TMR) type of magneto-resistive effect device (TMR device).

Figure 3:
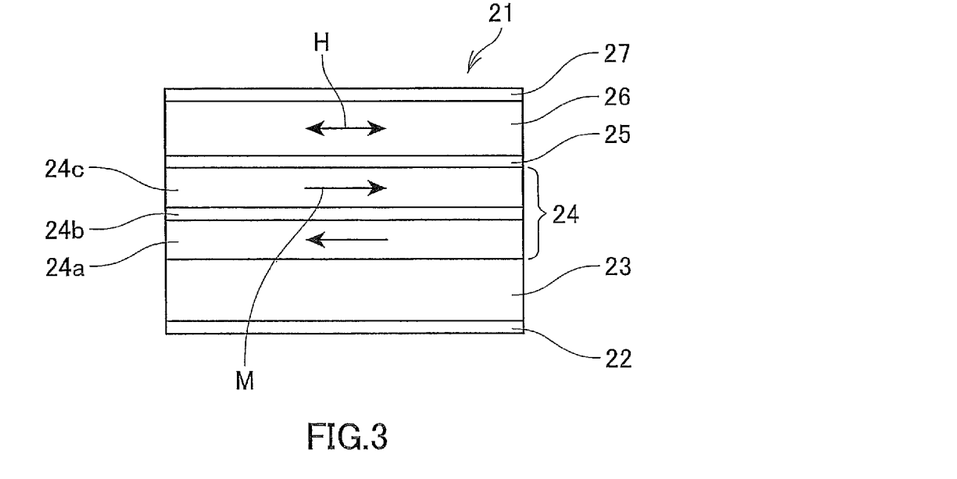
FIG. 3 is illustrative in section of one exemplary magneto-resistive effect device.

The TMR device is now explained. The TMR device comprises a magnetization-fixed layer (pinned magnetic layer) having a direction of magnetization preset in a specific direction and fixed relative to an external magnetic field change, and a magnetization-free layer (free magnetic layer) having a direction of magnetization changing with an external magnetic field change. Referring to FIG. 3 that is a sectional view of one exemplary TMR device, the TMR device, generally indicated by 21, has a stacked structure wherein a primer layer 22, an antiferromagnetic layer 23, a magnetization-fixed layer 24, a nonmagnetic layer 25, a magnetization-free layer 26 and a protective layer 27 are stacked on a substrate in this order.

The primer layer 22 is used to get rid of some influences of the substrate, for instance, an influence of the crystal axes of the substrate thereby improving on the crystallizability and orientation of the layers formed on the primer layer 22. The primer layer 22 may be formed of a material such as Ta and Ru. The antiferromagnetic layer 23 is provided to fix the direction of magnetization of the magnetization-fixed layer 24 by way of exchange coupling to the magnetization-fixed layer 24, and may be formed of an antiferromagnetic material such as IrMn and PtMn.

The magnetization-fixed layer 24 has a direction of magnetization fixed by way of exchange coupling to the antiferromagnetic layer 23 at the interface. As exemplified in FIG. 3, the magnetization-fixed layer 24 includes an outer layer 24a, a nonmagnetic intermediate layer 24b and an inner layer 24c stacked on the antiferromagnetic layer 23 in this order: it is a so-called synthetic fixed layer. The outer layer 24a and inner layer 24c are each formed of a soft magnetic material such as CoFe, CoFeB and CoNiFe. The outer layer 24a has a direction of magnetization fixed by way of exchange coupling to the antiferromagnetic layer 23, and the outer and inner layers 24a and 24c are antiferromagnetically coupled such that their directions of magnetization are oppositely fixed. The nonmagnetic intermediate layer 24b brings about antiferromagnetic exchange coupling between the outer and inner layers 24a and 24c to oppositely fix the directions of magnetization of the outer and inner layers 24a and 24c. Such nonmagnetic intermediate layer 24b is formed of a nonmagnetic material such as Ru. Where the magnetization-fixed layer 24 includes the outer layer 24a, the nonmagnetic intermediate layer 24b and the inner layer 24c, the direction of magnetization of the magnetization-fixed layer 24 is supposed to be defined by the direction of magnetization M of the inner layer 24c.

The nonmagnetic layer 25 is a tunnel barrier layer that, for instance, is formed by oxidization of a part or the whole of a magnesium layer. The magnetization-free layer 26 is formed of a soft magnetic material such as CoFe, CoFeB, NiFe and CoNiFe. The protective layer 27 is provided to allow for protection of the layers positioned below it, and formed of a material such as Ta, Ru, W and Ti.

With such TMR device 21, there is a change in the direction of magnetization H of the magnetization-free layer 26 depending on a magnetic field applied to the magnetization-free layer 26. More specifically, depending on the direction and magnitude of the magnetic field applied to the magnetization-free layer 26 there are changes in the direction and magnitude of magnetization H of the magnetization-free layer 26. The TMR device 21 has a resistance value changing dependent on the direction and magnitude of magnetization H of the magnetization-free layer 26. For instance where the magnitude of magnetization H of the magnetization-free layer 26 remains constant, the TMR device 21 has a minimum resistance value at the time when the direction of magnetization H of the magnetization-free layer 26 is the same as the direction of magnetization M of the magnetization-fixed layer 24, and a maximum resistance value at the time when the direction of magnetization H of the magnetization-free layer 26 is in opposition to the direction of magnetization M of the magnetization-fixed layer 24.

The TMR device 21 is of the CPP (current perpendicular to plane) type wherein there are currents flowing through it in a direction intersecting with the plane of each of the layers forming the TMR device 21, for instance, a direction perpendicular to the plane of each of the layers forming the TMR device 21. For instance, via electrodes (not shown) connected to the primer layer 22 and protective layer 27, respectively, there is a current supplied to the TMR device 21 to enable the magnetic sensor 1, 11 to generate a signal corresponding to the resistance value of the TMR device 21. This current flows in a direction intersecting with the plane of each of the layers forming the TMR device 21, for instance, a direction perpendicular to the plane of each of the layers forming the TMR device 21. It is then possible to supply a current having a constant value to the TMR device 21, thereby generating a signal corresponding to the resistance value of the TMR device 21 by a potential difference between both terminals of the TMR device 21.

Figure 4:
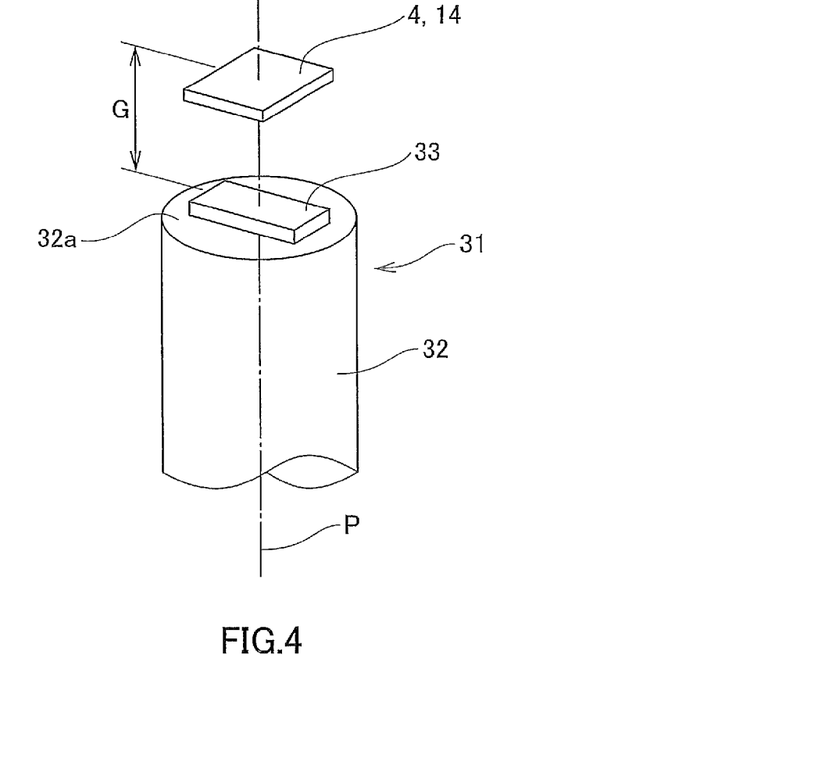
FIG. 4 is illustrative in perspective of exemplary use of a sensor chip making use of a TRM device.
Figure 5:
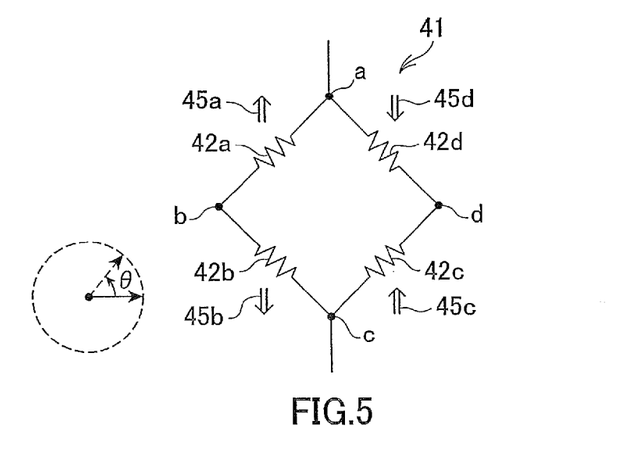
FIG. 5 is illustrative of an example of the Wheatstone bridge that a sensor chip includes.

For instance, the sensor chip 4, 14 making use of such a TMR device as described above may find use for such an angle-of-rotation detector as shown in FIG. 4. This angle-of-rotation detector, generally indicated by 31, comprises a shaft 32 rotatably supported with a shaft axis P as center, a permanent magnet 33 fixed onto one end face 32a of the shaft 32, and a sensor chip 4, 14 located in opposition to the permanent magnet 33 with a constant gap G between them. In such angle-of-rotation detector 31, the sensor chip 4, 14 is operable to detect the angle of rotation of the shaft 32, and includes such a Wheatstone bridge 41 as shown in FIG. 5. This Wheatstone bridge 41 includes four resistance portions 42a, 42b, 42c and 42d connected together in a substantially rectangular configuration, and each of the four resistance portions 42a, 42b, 42c and 42d is set up using one or two or more TMR devices. The coupling terminals a and c of the four resistance portions are connected to a power source to measure output voltages at coupling terminals b and d. The TMR devices built in the respective resistance portions 42a, 42b, 42c and 42d are each of such construction as shown in FIG. 3.

Figure 6:
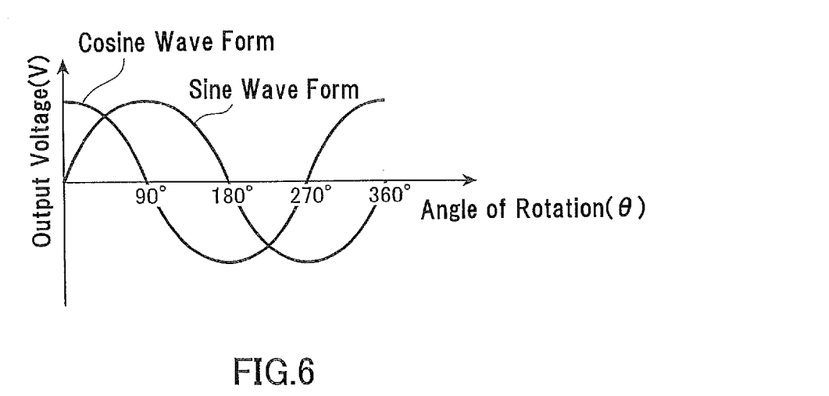
FIG. 6 is illustrative of an output voltage vs. angle-of-rotation relation measured by a sensor chip.

Referring to such Wheatstone bridge 41, the directions of magnetization M of the magnetization-fixed layers 24 (see FIG. 3) of the TMR devices built in the four resistance portions are indicated by arrows 45a, 45b, 45c and 45d in FIG. 5. In the Wheatstone bridge 41 as shown, the directions of magnetization M of the magnetization-fixed layers 24 of the adjacent TMR devices connected together are reversed 180° in the up-and-down direction of the drawing sheet. For this reason, the directions 45a and 45c as well as 45b and 45d of magnetization M of the magnetization-fixed layers 24 in the oppositely located TMR devices are in the same fixed direction. In this case, the magnetic field (of the permanent magnet 32) to be detected initially lies in the horizontal direction of the FIG. 5 sheet, and as it rotates from this state along a dotted line, it allows the relations between the angle of rotation θ and the output voltages at the coupling terminals b and d to take on such a sine wave form as shown in FIG. 6. It is thus possible to detect the angle of rotation θ from the measured output voltages on the basis of the sine wave form.

Figure 7:
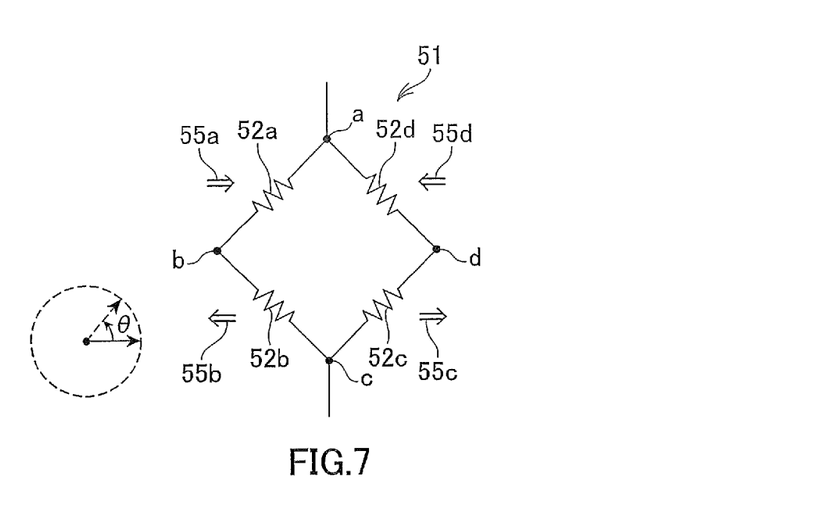
FIG. 7 is illustrative of a sensor chip that further includes a second Wheatstone bridge.

The sensor chip 4, 14 includes the aforesaid Wheatstone bridge 41 as a first Wheatstone bridge, and may further include such a second Wheatstone bridge 51 as shown in FIG. 7, as will be explained below.

As shown in FIG. 7, the second Wheatstone bridge 51 comprises four resistance portions 52a, 52b, 52c and 52d connected together in a substantially rectangular configuration, and each of the four resistance portions 52a, 52b, 52c and 52d is set up using one or two or more TMR devices. The coupling terminals a and c of the four resistance portions are connected to a power source to measure output voltages at coupling terminals b and d. The TMR devices built in the respective resistance portions 52a, 52b, 52c and 542d are each of such construction as shown in FIG. 3.

Referring to such second Wheatstone bridge 51, the directions of magnetization M of the magnetization-fixed layers 24 (see FIG. 3) of the TMR devices built in the four resistance portions are indicated by arrows 55a, 55b, 55c and 55d in FIG. 7. In the second Wheatstone bridge 51 as shown, the directions of magnetization M of the magnetization-fixed layers 24 of the adjacent TMR devices connected together are reversed 180° in the horizontal direction of the drawing sheet. For this reason, the directions 55a and 55c as well as 55b and 55d of magnetization M of the magnetization-fixed layers 24 in the oppositely located TMR devices are in the same fixed direction. In this case, the magnetic field (of the permanent magnet 32) to be detected initially lies in the horizontal direction of the FIG. 7 sheet, and as it rotates from this state along a dotted line, it allows the relations between the angle of rotation A and the output voltages at the coupling terminals b and d to take on such a cosine wave form as shown in FIG. 6.

The provision of such first and second Wheatstone bridges 41 and 51 enables the sine and cosine wave forms in FIG. 6 to be so used in combination that the angle of rotation can precisely be detected even at the same voltage.

The wiring portion 5, 15 forming a part of the magnetic sensor 1, 11 of the invention is provided for electric connection of the terminal 4a, 14a of the sensor chip 4, 14 to a connecting lead 6, 16, and in the embodiment shown, a bonding wire is used for it. The connecting lead 6, 16 is an electrode that is not only operable to capture an electric signal generated at the sensor chip 4, 14, but also serves as a mounting member for the magnetic sensor 1, 11. Such connecting lead 6, 16 may be formed of an electrically conductive material generally known as a lead frame material.

Low and high elastic-modulus resins 7, 17 and 8, 18 forming a part of the magnetic sensor 1, 11 are each a resin member for sealing up and protecting the sensor chip 4, 14 and wiring portion 5, 15.

The low elastic-modulus resin 7, 17 is provided to coat and seal up at least the sensor chip 4, 14; for instance, even when stress coming from an external force is applied to the magnetic sensor 1, 11, it works as a buffer against that stress, blocking and holding back the action of stress on the sensor chip 4, 14. Such low elastic-modulus resin 7, 17 has an elastic modulus ranging from 10 kPa to 80 MPa, and preferably 10 kPa to 250 kPa. At the low elastic-modulus resin 7, 17 has an elastic modulus of less than 10 kPa, the low elastic-modulus resin 7, 17 will be unable to produce a further buffer against the stress acting on the sensor chip 4, 14. In addition, the low elastic-modulus resin 7, 17 will be low in viscosity and thus poor in the ability to mold, often rendering it difficult to coat the sensor chip 4, 14 with the low elastic-modulus resin 7, 17. The low elastic-modulus resin 7, 17 having an elastic modulus exceeding 80 MPa are not preferable because its buffer against the stress acting on the sensor chip 4, 14 will get insufficient. For the low elastic-modulus resin 7, 17, use may be made of a resin material such as Si resin and heat-resistant coating material.

Figure 8:
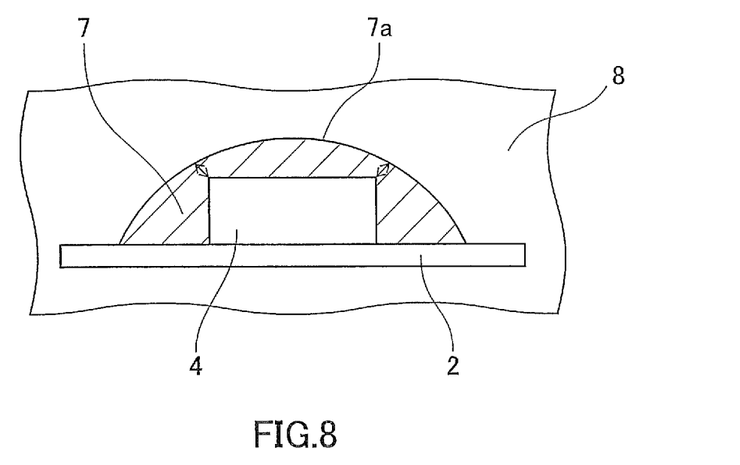
FIG. 8 is illustrative of the minimum thickness of a low elastic-modulus resin in the magnetic sensor of FIG. 1.
Figure 9:
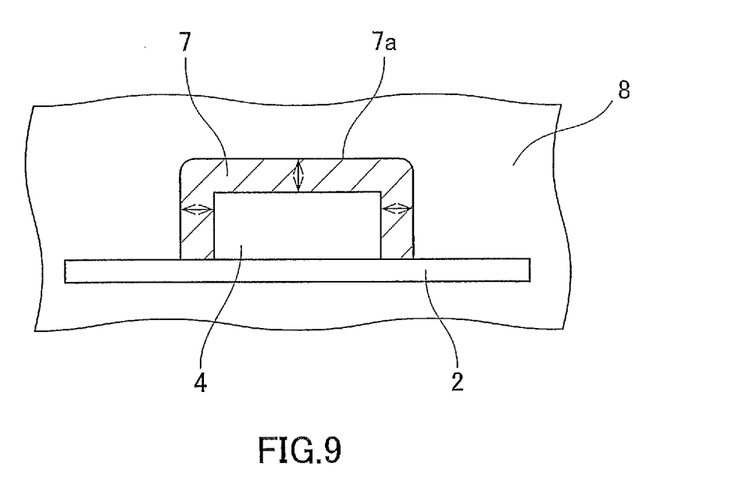
FIG. 9 is illustrative of another aspect of the low elastic-modulus resin in the magnetic sensor according to the invention.

Such low elastic-modulus resin 7, 17 should preferably have a minimum thickness of 5 μm or more in general and 10 μm or more in particular. The minimum thickness of the low elastic-modulus resin is here understood to refer to the thickness of the thinnest site found in the low elastic-modulus resin present in such a way as to coat the sensor chip; when any site of the sensor chip is not coated by the low elastic-modulus resin, the minimum thickness of the low elastic-modulus resin becomes zero. FIG. 8 is illustrative of the minimum thickness of the low elastic-modulus resin in the magnetic sensor 1 shown in FIG. 1. In the illustrated example, sites indicated by arrows have a minimum thickness in the low elastic-modulus resin 7 (indicated by hatchings) present in such a way as to coat the sensor chip 4. When the external-form surface 7a of the low elastic-modulus resin 7 is in a domed (round roof) shape and the external form of the sensor chip 4 is of a rectangular prism shape as shown in FIG. 8, the thickness of the low elastic-modulus resin 7 from the external-form surface 7a to the sensor chip 4 reaches a minimum in at least one of the four corners of the upper surface of the sensor chip 4 (on which the terminal 4a is positioned). Alternatively, as shown in FIG. 9, the low elastic-modulus resin 7 (indicated by hatchings) may be formed along the outer wall surface of the sensor chip 4 having an external form of a rectangular prism shape. In this example, the external-form surface 7a of the low elastic-modulus resin 7 is configured in conformity with the external-form surface of the sensor chip 4, and the low elastic-modulus resin 7 should preferably have a minimum thickness of 5 μm or more in general and 10 μm or more in particular. Preferably in this case, the low elastic-modulus resin 7 should have a uniform thickness around the sensor chip 4, and in the illustrated example, the low elastic-modulus resin 7 has a minimum thickness on the upper and side surfaces of the sensor chip 4, as indicated by arrows.

As the minimum thickness of such low elastic-modulus resin 7 is less than 5 μm, it may possibly cause the buffer of the low elastic-modulus resin 7 against the stress acting on the sensor chip 4 to get insufficient in this minimum thickness site. There is no particular limitation imposed on the configuration of the external-form surface 7a of the low elastic-modulus resin 7 provided that it has a minimum thickness of 5 μm or more; it may have such a domed configuration as shown in FIG. 8, such a rectangular prism configuration as shown in FIG. 9, or any other configuration such as a conical shape, a pyramid shape, and a truncated shape.

The high elastic-modulus resin 8, 18 provides a coating and sealing of at least the low elastic-modulus resin 7, 17 and the wiring portion 5, 15 to prevent and protect the sensor chip 4, 14 and wiring portion 5, 15 from damage by external forces. Such high elastic-modulus resin 8, 18 has an elastic modulus of 1 GPa or more, and it is preferred that there be an elastic modulus difference of $10^6$ or more between the high elastic-modulus resin 8, 18 and the low elastic-modulus resin 7, 17. As the high elastic-modulus resin 8, 18 has an elastic modulus of less than 1 GPa, it may possibly cause the protection of the sensor chip 4, 14 and wiring portion 5, 15 against external forces to get insufficient. For this high elastic-modulus resin 8, 18, use may be made of a resin material such as an epoxy resin.

It is here to be understood that the elastic modulus of the low elastic-modulus resin 7, 17, and high elastic-modulus resin 8, 18 is supposed to be measured using the plastic tensile testing method pursuant to JIS K7113. The abovementioned elastic modulus difference between the high and low elastic-modulus resins being $10^6$ or more is understood to mean that the high elastic-modulus resin has an elastic modulus $10^6$ times as high as that of the low elastic-modulus resin.

In such a magnetic sensor of the invention, the sensor chip is sealed up and protected by the resin member comprising a low elastic-modulus resin for coating and sealing up the sensor chip and a high elastic-modulus resin for coating and sealing up the low elastic-modulus resin. For this reason, even when stress coming from external forces acts on the magnetic sensor, the low elastic-modulus resin works as a buffer against that stress so that transfer of the stress to the sensor chip is blocked and held back, thereby keeping the sensor chip performance less affected. For instance, when the magnetic sensor of the invention is used as an angle sensor, it is thus possible to reduce errors of angle measurements down to a very low level.

The aforesaid embodiments of the magnetic sensor are provided by way of example but not by way of limitation. While the abovementioned embodiments have been explained typically with reference to the magneto-resistive effect device defined by the TMR device, it is to be noted that use may also be made of a giant magneto-resistive effect (GMR) type of magneto-resistive effect device (GMR device), and an anisotropic magneto-resistive effect (AMR) type of magneto-resistive effect device (AMR device) as well. Where the magneto-resistive effect device is the GMR device, it is required that the nonmagnetic layer 25 in FIG. 3 be formed of a highly conductive nonmagnetic layer such as Cu, and Ag. The GMR device, if used, may be of such a CPP type as described above, or a CIP (current-in-plane) type of passing currents in a direction substantially parallel with the planes of the respective layers forming the magneto-resistive effect device. For instance, where the GMR device used is of the CIP type, two electrodes (not shown) are connected to two discrete positions on the protective layer 27 of FIG. 3 to feed currents to the GMR device. Those currents flow in a direction substantially parallel with the planes of the respective layers forming the GMR device. In this case, too, it is possible to generate a signal matching with the resistance value of the GMR device by a potential difference between the two electrodes.

The present invention will now be explained in greater details with reference to some specific examples.

Example 1

Figure 10:
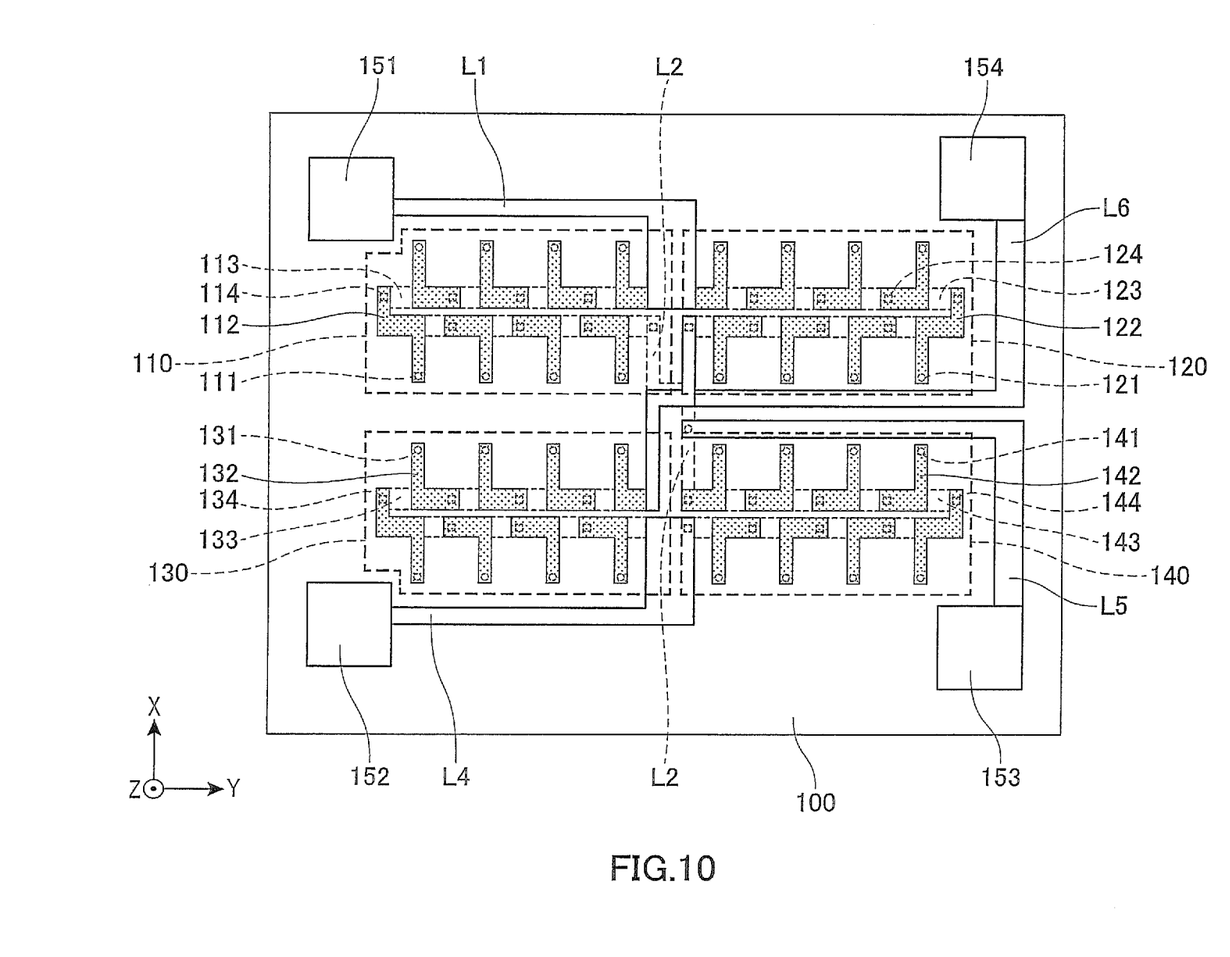
FIG. 10 is a plan view of the whole structure of a sensor chip used in the inventive examples.
Figure 11:
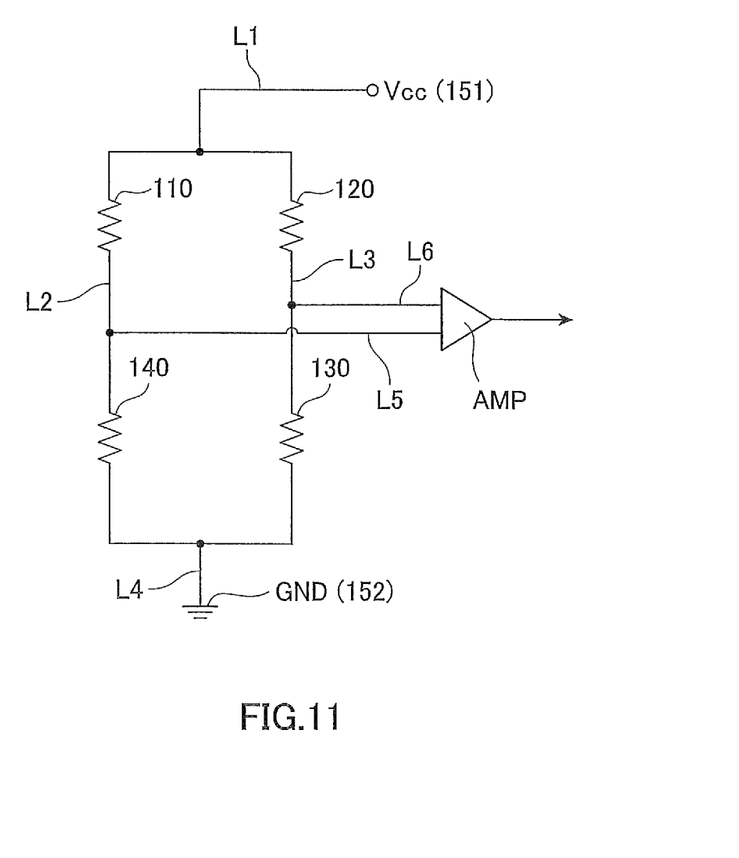
FIG. 11 is an equivalent circuit diagram of the sensor chip used in the inventive examples.

Provision was first made of a sensor chip having such a structure as shown in FIG. 10 (in the form of a 400 μm thick rectangular prism of 800 μm×600 μm). This sensor chip includes on a Si substrate 100 four resistance portions 110, 120, 130, 140, terminals 151, 152, 153, 154 and wirings L1 to L6 so as to detect the direction and magnitude of a magnetic field changing on the XY plane shown. FIG. 11 is an equivalent circuitry diagram for this sensor chip in which the four resistance portions 110, 120, 130, 140 are connected together via the wirings L1 to L4, forming a Wheatstone bridge. The terminal 151 is connected to an external power source Vcc, the terminal 152 is externally grounded, and the terminals 153 and 154 is connected to an input terminal of an external differential detector AMP.

Figure 12:
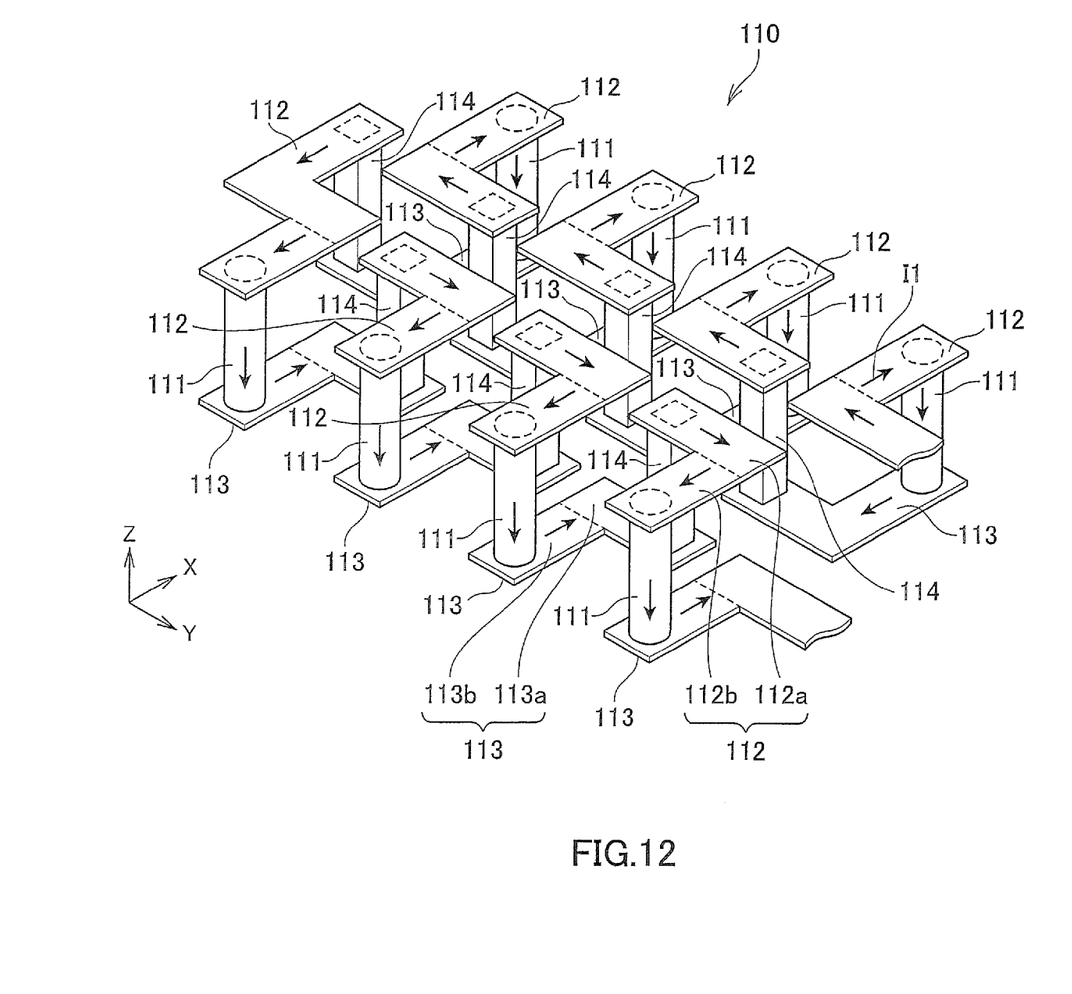
FIG. 12 is illustrative in perspective of a resistance portion of the sensor chip used in the inventive examples.

The resistance portions 110, 120, 130, 140 each have 50 such TMR devices 111, 121, 131, 141 as shown in FIG. 3, and the construction of the resistance portion 110 is illustrated in FIG. 12. The resistance portion 120, 130, 140 being substantially the same in construction as the resistance portion 110, only the resistance portion 110 is now explained. In the resistance portion 110, the 50 TMR devices were connected with one another in series via an upper electrode 112, a lower electrode 113 and a columnar connector 114. For the sake of convenience, each resistance portion is shown in FIGS. 10 and 12 to include 8 TMR devices. The upper and lower electrodes 112 and 113 each include a main portion 112a, 113a extending along the sequential (Y-axis) direction of the adjacent TMR devices 111 and a branch portion 112b, 113b extending along the stacking planes of the layers forming the TMR device 111 in the direction (the X-axis direction) orthogonal to the extending direction of the main portion 112a, 113a. The branch portions 112b and 113b are oppositely located with the TMR device 111 sandwiched between them in the thickness direction (the stacking direction of the respective layers), and come in contact with the upper and lower surfaces of the TMR device 111, respectively. The main portion 112a of the upper electrode 112 having the branch portion 112b connected to one TMR device 111 is connected to the main portion 113a of the lower electrode 113 having the branch portion 113b connected to an adjoining other TMR device 111. The upper electrode 112 positioned at one end of such resistance portion 110 is connected to the TMR device 111, and to the wiring L1 (see FIG. 10) as well. The lower electrode 113 positioned at the other end of the resistance portion 110 is connected to the TMR device 111, and to the wiring L2 (see FIG. 10) as well. Such an arrangement ensures that upon supply of a reading current from the wiring L1, the reading current will flow into the wiring L2 via 8 TMR devices 111 one by one.

Then, a thin sheet of conductive material was processed into a lead frame including a base portion and connecting leads positioned in such a way as to surround the base portion.

The aforesaid sensor chip was mounted on the base portion of the lead frame via a conductive paste, and the respective sensor chip terminals were electrically connected to the respective connecting leads by means of wire bonding.

Then, a resin I was fed dropwise onto the sensor chip from above for its coating. For the resin I used for the coating of the sensor chip, there were eight resins used having such post-molding elastic moduli as set out in the following Table 1. The resin I thus coated on the sensor chip was of a domed surface shape (see FIG. 1). The thinnest sites of the resin I coated on the sensor chip from its surface down to the sensor chip were the corners of the sensor chip of a rectangular prism shape, and the minimum thickness of the resin at these sites (see the arrow in FIG. 4) was 10 μm. Note here that the elastic moduli were measured by the plastic tensile testing method pursuant to JIS K7113 throughout the examples.

Then, the lead frame was placed in a molding die for injection of an epoxy resin (CEL Series made by Hitachi Chemical Company Ltd.) by means of an injection molding process thereby forming a resin II in such a way as to seal up the aforesaid resin I coated on the sensor chip, the base portion, and the bonding wires. This resin II was found to have an elastic modulus of 22 GPa as measured as described above.

Thereafter, the connecting leads were cut off the lead frame to prepare such a magnetic sensor as shown in FIG. 1 (Samples 1 to 8).

Then, the thus prepared magnetic sensor (Samples 1 to 8) was mounted on a 1.2 mm thick printed wiring board of 2.0 mm×2.0 mm. This printed wiring board included four fixing aperture portions formed in such a way as to define the vertexes of a square, and the magnetic sensor was mounted such that it was positioned at the center of four such fixing aperture portions.

The printed wiring board having the magnetic sensor mounted in place as described above was attached to a board attachment jig. The board attachment jig used here comprised a planar plate type base portion provided with four columnar support portions. The printed wiring board was attached to the board attachment jig by aligning the four fixing aperture portions in the printed wiring board with the tops of the four columnar support portions on the board attachment jig, and fixing the assembly together by means of screws. Via a 0.38 mm thick spacer for one of the four columnar support portions on the board attachment jig, the printed wiring board was fixed in place such that a vertical displacement could be given to the printed wiring board to add stress to it in a torsion direction.

Before and after the vertical displacement was given to the printed wiring board attached to such a board attachment jig as described above, changes in the angle measured by the magnetic sensor (Samples 1 to 8) were measured. The measurements were figured out as the amounts of angle fluctuation, as set out in the following Table 1.

TABLE 1

| Magnetic Sensor | Elastic Modulus of Resin I | Amounts of Angle Fluctuation [deg] |
| --- | --- | --- |
| Sample 1 | 10 kPa | 0.050 |
| Sample 2 | 15 kPa | 0.064 |
| Sample 3 | 100 kPa | 0.078 |
| Sample 4 | 250 kPa | 0.098 |
| Sample 5 | 80 MPa | 1.150 |
| Sample 6 | 900 MPa | 0.164 |
| Sample 7 | 10 GPa | 0.217 |
| Sample 8 | 22 GPa | 0.223 |

As can be seen from Table 1, it has been found that that when the resin I is a low elastic-modulus resin having an elastic modulus of 80 MPa or less, amounts of angle fluctuation of 0.15 [deg] or less are achieved, and when the resin I is a low elastic-modulus resin having an elastic modulus of 250 kPa or less, lower amounts of angle fluctuation of 0.10 [deg] or less are achievable.

Example 2

Provision was made of a sensor chip and a lead frame as described with reference to Example 1. The aforesaid sensor chip was mounted on the base portion of the lead frame via a conductive paste, and the respective terminals of the sensor chip were electrically connected to the respective connecting leads by means of wire bonding.

Then, a Si resin (KER Series made by Shin-Etsu Chemical Company, Ltd.) was fed dropwise onto the sensor chip from above to form a low elastic-modulus resin for coating the sensor chip. This low elastic-modulus resin had an elastic modulus of 10 kPa and was of a domed surface shape (see FIG. 1). The thinnest sites of the sensor chip-coating low elastic-modulus resin from its surface down to the sensor chip were the corners of the sensor chip in a rectangular prism configuration, where the minimum thickness of the low elastic-modulus resin was 10 μm (see the arrows in FIG. 8).

Then, the lead frame was placed in a molding die for injection of an epoxy resin (CEL Series made by Hitachi Chemical Company Ltd.) by means of an injection molding process thereby forming a high elastic-modulus resin in such a way as to seal up the base portion, sensor chip, low elastic-modulus resin and bonding wires. This high elastic-modulus resin was found to have an elastic modulus of 22 GPa as measured as described above, with an elastic-modulus difference of $10^6$ or more from that of the aforesaid low elastic-modulus resin.

Thereafter, the connecting leads were cut off the lead frame to prepare such a magnetic sensor (Sample A) as shown in FIG. 1.

There was a magnetic sensor (Sample B) prepared as was the case with Sample A except that the minimum thickness of the low elastic-modulus resin at the corners of the sensor chip of a rectangular prism shape was set at 5 μm.

There was a magnetic sensor (Sample C) prepared as was the case with Sample 1 except that the minimum thickness of the low elastic-modulus resin at the corners of the sensor chip of a rectangular prism shape was set at 2 μm.

There was a magnetic sensor (Sample D) prepared as was the case with Sample A except that the sensor chip was not coated with the low elastic-modulus resin and the base portion, sensor chip and bonding wires were coated only by use of the high elastic-modulus resin.

There was a magnetic sensor (Sample E) prepared as was the case with Sample A except that only the upper surface of the sensor chip of a rectangular prism shape was coated with the low elastic-modulus resin.

There was a magnetic sensor (Sample F) prepared as was the case with Sample A except that only the sides of the sensor chip of a rectangular prism shape were coated with the low elastic-modulus resin.

There were magnetic sensors (Samples G, H) prepared as was the case with Sample A except that the minimum thickness of the low elastic-modulus resin at the corners of the sensor chip of a rectangular prism shape was set at 80 μm, and 90 μm.

As in Example 1, the aforesaid magnetic sensors (Samples A to H) were mounted on the printed wiring board. Before and after the vertical displacement was given to the printed wiring board attached to such a board attachment jig as in Example 1, changes in the angle measured by the magnetic sensor (Samples A to H) were measured. The measurements were figured out as the amounts of angle fluctuation, as set out in the following Table 2.

TABLE 2

| Magnetic Sensor | Minimum Thickness of the Low Elastic-Modulus Resin [μm] | Amounts of Angle Fluctuation [deg] |
| --- | --- | --- |
| Sample A | 10 | 0.070 |
| Sample B | 5 | 0.076 |
| Sample C | 2 | 0.195 |
| Sample D | 0 | 0.242 |
| Sample E | 0 | 0.212 |
| Sample F | 0 | 0.228 |
| Sample G | 80 | 0.069 |
| Sample H | 90 | 0.066 |

As can be seen from Table 2, it has been found that when the low elastic-modulus resin has a minimum thickness of 5 μm or more, amounts of angle fluctuation of 0.10 [deg] or less are achieved, and that when the low elastic-modulus resin has a minimum thickness of 10 μm or more, there is a tendency for the amounts of angle fluctuation to decrease a lot more.

Example 3

A magnetic sensor (Samples A' to H') corresponding to that (Samples A to H) of Example 2 was prepared as in Example 2 except that a resin having an elastic modulus of 250 kPa was used as the low elastic-modulus resin.

As in Example 1, the aforesaid magnetic sensors (Samples A' to H') were mounted on the printed wiring board. Before and after the vertical displacement was given to the printed wiring board attached to the board attachment jig as in Example 1, changes in the angle measured by the magnetic sensors (Samples A' to H') were measured. The measurements were figured out as the amounts of angle fluctuation, as set out in the following Table 3.

TABLE 3

| Magnetic Sensor | Minimum Thickness of the Low Elastic-Modulus Resin [μm] | Amounts of Angle Fluctuation [deg] |
| --- | --- | --- |
| Sample A' | 10 | 0.098 |
| Sample B' | 5 | 0.099 |
| Sample C' | 2 | 0.231 |
| Sample D' | 0 | 0.242 |
| Sample E' | 0 | 0.230 |
| Sample F' | 0 | 0.239 |
| Sample G' | 80 | 0.092 |
| Sample H' | 90 | 0.093 |

As can be seen from Table 3, it has been found that when the low elastic-modulus resin has a minimum thickness of 5 μm or more, amounts of angle fluctuation of 0.10 [deg] or less are achieved, and that when the low elastic-modulus resin has a minimum thickness of 10 μm or more, there is a tendency for the amounts of angle fluctuation to decrease a lot more.

What is claimed is:

1. A magnetic sensor, comprising a base portion, a sensor chip positioned on said base portion, a wiring portion adapted to electrically connect a terminal of said sensor chip to a connecting lead, a resin having a low elastic modulus for coating at least said sensor chip, and a resin having a high elastic modulus for coating at least said low elastic-modulus resin and said wiring portion, wherein said sensor chip includes a tunnel magneto-resistive effect (TMR) type of magneto-resistive effect device, and said low elastic-modulus resin has an elastic modulus ranging from 10 to 250 kPa while said high elastic-modulus resin has an elastic modulus of 1 GPa or more, and said low elastic-modulus resin for coating said sensor chip has a minimum thickness of 5 μm or more.

2. The magnetic sensor according to claim 1, wherein said low elastic-modulus resin for coating said sensor chip has a minimum thickness of 10 μm or more.

3. The magnetic sensor of claim 2, wherein application of an external force achieves an amount of angle fluctuation of up to 0.10 [deg].

4. The magnetic sensor of claim 1, wherein application of an external force achieves an amount of angle fluctuation of up to 0.10 [deg].

* * * * *